United States Patent
Nicholls et al.

(10) Patent No.: US 8,884,706 B2
(45) Date of Patent: *Nov. 11, 2014

(54) SYSTEM AND METHOD FOR BUILT IN SELF TEST FOR TIMING MODULE HOLDOVER

(75) Inventors: Charles Nicholls, Nepean (CA); Philippe Wu, Kanata (CA)

(73) Assignee: BlackBerry Limited, Waterloo, Ontario (CA)

(*) Notice: Subject to any disclaimer, the term of this patent is extended or adjusted under 35 U.S.C. 154(b) by 852 days.

This patent is subject to a terminal disclaimer.

(21) Appl. No.: 13/072,285

(22) Filed: Mar. 25, 2011

(65) Prior Publication Data

US 2011/0169577 A1   Jul. 14, 2011

Related U.S. Application Data

(63) Continuation of application No. 12/497,980, filed on Jul. 6, 2009, now Pat. No. 7,915,962.

(51) Int. Cl.
*H03L 7/00* (2006.01)
*H03L 1/02* (2006.01)
*H03L 7/08* (2006.01)
*H03L 7/14* (2006.01)

(52) U.S. Cl.
CPC ............ *H03L 1/026* (2013.01); *H03L 7/0805* (2013.01); *H03L 7/146* (2013.01); *H03L 1/028* (2013.01)
USPC ................... 331/17; 331/14; 331/18; 331/44

(58) Field of Classification Search
USPC ........................ 331/2, 14, 16–18, 44, 46, 47
See application file for complete search history.

(56) References Cited

U.S. PATENT DOCUMENTS 4,582,434 A    4/1986   Plangger et al.
6,307,896 B1   10/2001  Gumm et al.
(Continued)

FOREIGN PATENT DOCUMENTS

CN    1293494      5/2001
CN    1531296      9/2004
CN    101079687    11/2007

OTHER PUBLICATIONS

Extended European Search Report issued in European Application No. 12199359.6 on Jun. 11, 2013; 12 pages.

(Continued)

*Primary Examiner* — Joseph Chang
*Assistant Examiner* — Jeffrey Shin
(74) *Attorney, Agent, or Firm* — Fish & Richardson P.C.

(57) ABSTRACT

Embodiments of the invention include a method for use in a device having a local oscillator. The method includes performing, for the local oscillator that is disciplined by an external reference signal, while locked to the external reference signal, training at least two mathematical models of the oscillator to determine a predicted correction signal for each mathematical model based at least in part on a correction signal that is a function of the external reference signal and which is used to discipline drift in the oscillator. The method also includes selecting a mathematical model of the at least two mathematical models that results in a smallest time error when disciplining the oscillator to use when the external reference signal is unavailable and an alternative correction signal is to be used to discipline drift in the oscillator. The method further includes testing the selected mathematical model using a sampled version of the correction signal such that the selected mathematical model can be used without the need for a testing duration that is in addition to a period of time used for the training.

8 Claims, 9 Drawing Sheets

(56) References Cited

U.S. PATENT DOCUMENTS

| | | |
|---|---|---|
| 6,711,230 B1 | 3/2004 | Nicholls et al. |
| 6,901,106 B1 | 5/2005 | Chen et al. |
| 7,015,762 B1 | 3/2006 | Nicholls et al. |
| 7,126,429 B2 | 10/2006 | Mitric |
| 7,146,146 B2 | 12/2006 | Masenten et al. |
| 7,424,069 B1 * | 9/2008 | Nicholls et al. .............. 375/339 |
| 7,545,228 B1 | 6/2009 | Lu et al. |
| 7,764,131 B1 | 7/2010 | Seth et al. |
| 7,915,962 B2 * | 3/2011 | Nicholls et al. ................ 331/18 |
| 2001/0015678 A1 | 8/2001 | Wesolowski |
| 2001/0053176 A1 | 12/2001 | Fry et al. |
| 2004/0180630 A1 | 9/2004 | Ichihara |
| 2006/0071724 A1 | 4/2006 | Bartholomew |
| 2009/0167443 A1 | 7/2009 | Liu et al. |
| 2010/0321118 A1 | 12/2010 | Smiley et al. |
| 2010/0321122 A1 | 12/2010 | Smiley |
| 2011/0169577 A1 | 7/2011 | Nicholls et al. |

OTHER PUBLICATIONS

Specification of U.S. Appl. No. 12/487,933, filed Jun. 19, 2009.
Specification of U.S. Appl. No. 12/487,948, filed Jun. 19, 2009.
TrueTime Model 560-5203-0, "Disciplined TCX0 Oscillator Manual", May 31, 2000, http://www.symmetricom.com/media/files/support/ttm/product-manual/man-560-5203-0.pdf, 27 pages.
International Search Report and Written Opinion for corresponding PCT Patent Application No. PCT/CA2010/000827, dated Sep. 16, 2010, 8 pages.
International Search Report and Written Opinion for corresponding PCT Patent Application No. PCT/CA2010/000828, dated Sep. 16, 2010, 8 pages.
Penrod B.M., "Adaptive temperature compensation of GPS disciplined quartz and rubidium oscillators", Frequency Control Symposium, Proceedings of the 1996 IEEE International, Jun. 5, 1996, pp. 980-987.
European Search Report for corresponding European Patent Application No. 10168545.1, date of completion of search: Sep. 24, 2010, 2 pages.
Notice of Allowance issued in U.S. Appl. No. 12/497,980 on Nov. 4, 2010; 8 pages.
Communication under Rule 71(3) EPC issued in European Application No. 10168545.1 on Sep. 3, 2012; 8 pages.
Notice of References Cited from related U.S. Appl. No. 12/487,948, Feb. 2, 2011, 1 page.
Notice of References Cited from related U.S. Appl. No. 12/487,933, Jan. 21, 2011, 1 page.
Partial European Search Report issued in European Application No. 12199359.6 on Mar. 8, 2013; 6 pages.
Office Action issued in Chinese Application No. 201010274849.X on Jan. 6, 2014; 29 pages.
Office Action issued in U.S. Appl. No. 13/618,387 on Mar. 20, 2014; 7 pages.
Office Action issued in Japanese Application No. 2010-154195 on Mar. 3, 2014; 3 pages. No English translation.

* cited by examiner

SYSTEM AND METHOD FOR BUILT IN SELF TEST FOR TIMING MODULE HOLDOVER

RELATED APPLICATIONS

This application is a continuation of U.S. patent application Ser. No. 12/497,980 filed on Jul. 6, 2009, which is hereby incorporated by reference in its entirety, and claims the benefit thereof.

FIELD OF THE INVENTION

The invention relates to disciplining the timing value of a local oscillator.

BACKGROUND OF THE INVENTION

In some networks, a network node of the network may have a local oscillator (LO) that is used for timing purposes at the network node. To reduce the cost of the network node, the LO may not be as accurate as a master timing reference source that provides a timing signal to the network.

When an external timing reference source is used to discipline the LO, if for some reason the external timing reference is unable to be used to discipline the local oscillator, for example in the case where a GPS signal is used as the external timing reference source and the GPS lock is lost, or if a network malfunction means that a network timing reference is unavailable, then performance of the network node and any other nodes that may rely on the network node's local timing signal may be impaired. Once the external timing reference is unavailable then human intervention may be required to correct or reset the timing of the network node. However, human intervention can be time consuming and costly to implement.

When the external timing reference is unavailable, it is still desirable to maintain the operation of the local oscillator such that over a duration of time an error in the local oscillator output is limited to a particular value.

In the Worldwide Interoperability for Microwave Access (WiMAX) standard for example, the particular value of time error is 25 µs over a duration of 24 hours. In 4G long term evolution (LTE) systems, the duration is even more stringent, namely 10 µs over 24 hours.

SUMMARY OF THE INVENTION

According to a first aspect of the invention, there is provided a method comprising: for an oscillator local to a device that is disciplined by an external reference signal, for a duration of time the oscillator is locked to the external reference signal: determining a correction signal that is a function of the external reference signal and which is used to discipline the oscillator; sampling the correction signal; storing samples of the correction signal; for at least one mathematical model of the oscillator, for the duration of time the oscillator is locked to the external reference signal: training the at least one mathematical model based at least on the correction signal without the samples of the correction signal; after a specified duration of time of the oscillator being locked to the external reference signal; determining a predicted correction signal; determining a difference between the predicted correction signal and the samples of the correction signal to produce a frequency error that represents an error that would occur if the predicted correction signal was used to discipline drift in the oscillator; integrating over time the frequency error to produce a time error that represents an error that would occur if the predicted correction signal was used to discipline drift in the oscillator; outputting the time error.

In some embodiments the method further comprises: determining whether the time error is less than a threshold of an allowable time error for the specified duration of time.

In some embodiments the method further comprises: periodically updating the frequency error, time error and whether the time error is less than the threshold at a given interval subsequent to the specified duration of time.

In some embodiments determining the frequency error, the time error and whether the time error is less than the threshold of the allowable time error comprises: determining the frequency error, the time error and whether the time error is less than the threshold of the allowable time error after a duration of time that is less than the specified duration of time.

In some embodiments periodically updating the frequency error, time error and whether the time error is less than the threshold comprises: updating the frequency error, time error and whether the time error is less than the threshold for a moving temporal window equal to or longer than the specified duration of time if the duration of time the oscillator is locked to the external reference signal becomes larger than the specified duration of time.

In some embodiments the method further comprises: for two or more mathematical models of the at least one mathematical model; determining which mathematical model produces a time error that if used to discipline the oscillator would result in the smallest time error.

In some embodiments the method further comprises: determining which mathematical model produces a time error that if used to discipline the oscillator would result in the smallest time error comprises: comparing the determined time errors for each mathematical model; and selecting the mathematical model with a smallest cumulative time error that is less than a threshold of an allowable time error.

In some embodiments the method further comprises: for the mathematical model that would result in the smallest time error, selecting that mathematical model as a correction signal to discipline the oscillator when the external reference signal is unavailable.

In some embodiments the method further comprises: maintaining for the specified duration of time an identification of the mathematical model that is selected as having the smallest time error for the particular duration of time; and maintaining for at least one interval after the specified duration of time an identification of the mathematical model that is selected as having the smallest time error for each interval.

In some embodiments the method further comprises: maintaining mathematical model parameters associated with the identified mathematical models.

In some embodiments the method further comprises: outputting for each interval after the specified duration of time, for each mathematical model the time error for that interval; and outputting the mathematical model parameters associated with the identified mathematical models, for each mathematical model, for that interval.

In some embodiments sampling the correction signal while locked to the external reference signal comprises sampling the correction signal at a rate that is less than the rate of the correction signal.

In some embodiments the method further comprises: disciplining the oscillator as early as at the end of the specified duration of time using the selected mathematical model determined to have the smallest time error without an additional testing period for testing the selected mathematical model.

In some embodiments the method further comprises: if it is determined that none of the at least one mathematical models are less than a threshold of an allowable time error, determining a duration for each mathematical model over which the mathematical model does not exceed the threshold.

In some embodiments the method further comprises: selecting the mathematical model with the longest duration before exceeding the threshold; and using the selected mathematical model as a correction signal to discipline the oscillator when the external reference signal is unavailable for at least a duration that the selected mathematical model does not exceed the threshold.

According to a second aspect of the invention, there is provided a method comprising: for an oscillator local to a device that is disciplined by an external reference signal, while locked to the external reference signal: training at least two mathematical models of the oscillator to determine a predicted correction signal for each mathematical model based at least in part on a correction signal that is a function of the external reference signal and which is used to discipline drift in the oscillator; selecting a mathematical model of the at least two mathematical models having a smallest time error to discipline drift in the oscillator when the external reference signal is unavailable; and testing the selected mathematical model using a sampled version of the correction signal such that the selected mathematical model can be used without the need for a testing duration that is in addition to a period of time used for the training.

According to a third aspect of the invention, there is provided a device comprising: a receiver for receiving an external reference signal; a local oscillator (LO) configured to generate a first signal comprising at least one of: timing information; frequency information; phase information; and combinations thereof; a control loop filter for generating a correction signal that is a function of the external reference signal and which is used to discipline the LO; a sample data buffer for storing samples of the correction signal, timing information from the external reference signal, and temperature information; at least one mathematical model of the LO configured to receive the correction signal, the timing information from the external reference signal, and the temperature information, each of the at least one mathematical model configured to generate a predicted correction signal; a time interval error checker (TIEC) configured to: for each mathematical model: determine a difference between the predicted correction signal and samples of the correction signal to produce a frequency error that represents an error that would occur if the predicted correction signal was used to discipline drift in the oscillator; integrate over time the frequency error to produce a time error that represents an error that would occur if the predicted correction signal was used to discipline drift in the oscillator; select a mathematical model having a smallest time error; a digital to analog control (DAC) selector configured to receive the correction signal output from the control loop filter and a correction signal from the TIEC that is a function of the selected mathematical model; a DAC configured to receive an output from the DAC selector and provide a signal to the LO; wherein when the external reference signal is available the DAC control selector provides the control signal to the DAC such that the oscillator is disciplined as a function of the external reference signal, the at least one mathematical models are trained to generate a predicted correction signal and the TIEC determines the time error after a specified duration of time and periodically updates the time error at a given interval subsequent to the particular duration of time.

In some embodiments the LO is an ovenized crystal oscillator.

In some embodiments the at least one mathematical model is a recursive least squares fit model.

In some embodiments the at least one mathematical model is at least one of: a model that includes both temperature and ageing dependent parameters; a model that includes temperature dependent parameters; a model that includes a constant value; and a model that includes parameters of a model that was selected to have the smallest time error in a previous given interval.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the invention will now be described with reference to the attached drawings in which.

DETAILED DESCRIPTION OF THE EMBODIMENTS OF THE INVENTION

Figure 1:
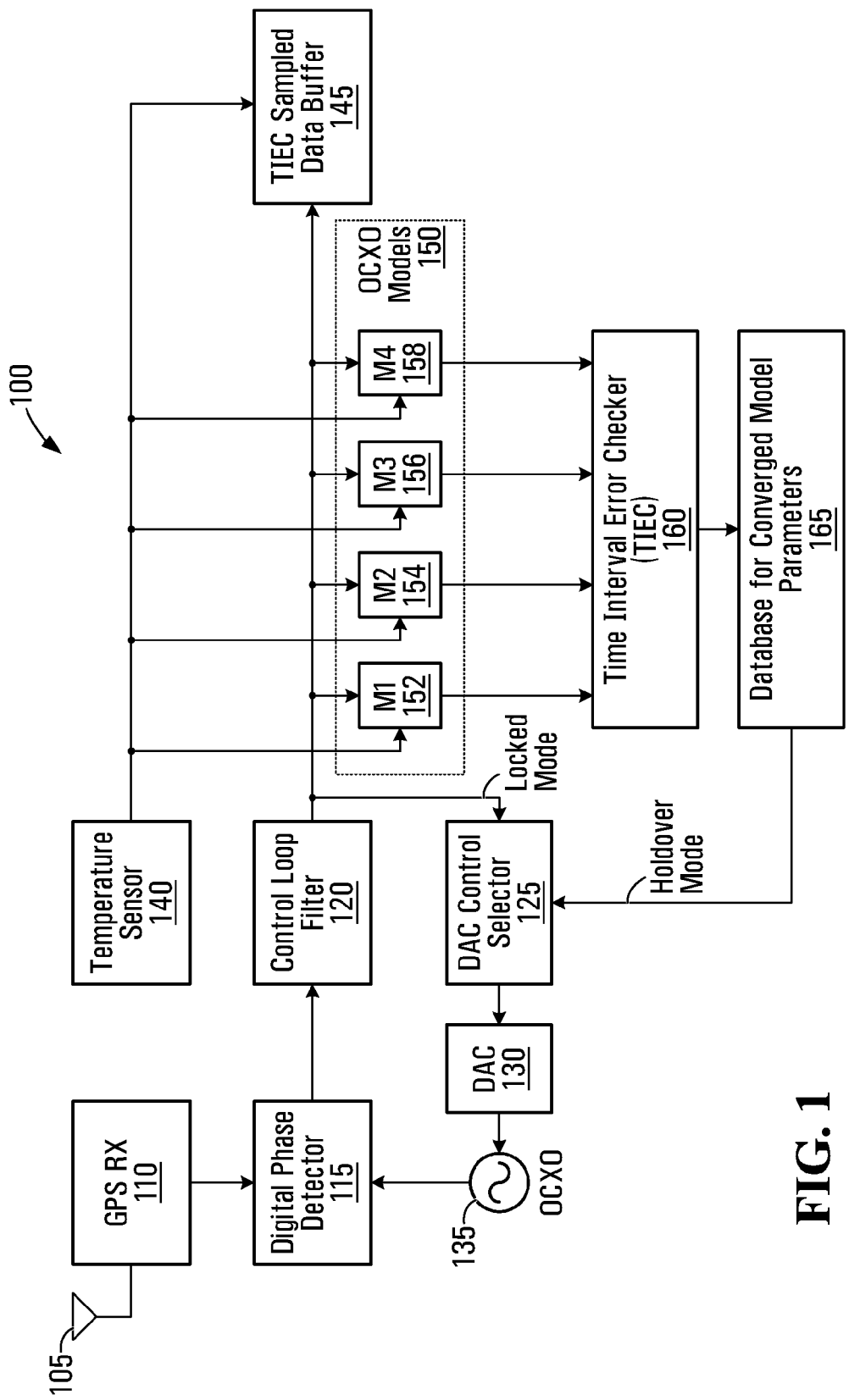
FIG. 1 is a schematic diagram of a device in which some embodiments of the present invention may be implemented.

When a Universal Radio Module (URM) having a local oscillator is disciplined by an external reference signal, the local oscillator maintains synchronization with the external reference signal. In an example of an LTE system in which the URM is part of a base station, the local oscillator is disciplined so as to maintain base station synchronization to the external reference signal to within +/−1.5 μs and a maximum frequency error of +/−50 parts per billion (ppb) measured at an antenna port of the base station. When the external reference signal is available and being used to discipline the local oscillator the URM is considered to be in a locked state. If and when the external reference signal becomes unavailable, or otherwise cannot be used to discipline the local oscillator, then the URM is considered to be in a holdover state, in which an alternative signal is used to discipline the local oscillator.

An alternative signal used to discipline the local oscillator may result from a mathematical model of the performance of the oscillator. The mathematical model can be trained when the URM is operating in the locked state.

Holdover readiness is defined as a state in which a network timing synchronization (NTS) module can maintain a time error below a predefined value over a particular holdover duration. In some embodiments, the NTS module may include oscillator models and a time interval error checker as described in detail below. The NTS module may also include other components of software, hardware or firmware utilized for maintaining synchronization of a device including a local oscillator to that of the network in which the device resides. For a particular implementation of the invention the time error is to be maintained below an absolute value of 9.5 µs over a holdover duration of 24 hours, subject to the constraint that training temperature bounds are not exceeded during the holdover state.

In a particular implementation of the invention the oscillator is an ovenized crystal oscillator (OCXO), which is an oscillator that is substantially temperature controlled during operation. The locked state specifications are met by phase locking the OCXO to a 1 pulse per second (pps) timing signal. In a particular implementation the timing signal is a Global Positioning System (GPS) signal or equivalent global navigation satellite system (GNSS) signal recovered using a GPS receiver or GNSS receiver technology. In the event that the GPS signal is interrupted due to a GPS reception problem, the holdover state is entered. During the holdover state a maximum frequency accuracy of +/−50 ppb should be maintained and the allowable time error is increased to 10 µs over a period of 24 hours. The period of 24 hours is selected as a representative duration that enables time to identify and address the reason for the unavailability of the external reference signal. For example, this may allow an operator sufficient time to address and correct the GPS reception problem.

The invention is not to be limited to only ovenized crystal oscillators. In alternative embodiments of the invention different types of oscillators may be used. The operation of ovenized crystal oscillators can be modeled using a quadratic function. Some types of oscillators are modeled by higher order functions that may result in larger time errors over a shorter period of time than oscillators that are modeled by lower order functions, such as the quadratic function used to model the OCXO.

The specific examples of parameter values for maximum frequency accuracy, allowable time error and holdover duration to which the allowable time error pertains that are described above are particular examples of such values and not intended to limit the scope of the invention. Depending on implementation specifics, the parameter values may be larger or smaller than the examples specifically described.

A GPS signal or a GNSS signal is identified above as an external reference signal for a particular implementation. However, more generally, the external reference signal is not limited to GPS/GNSS signals, but is implementation specific. The external reference signal can be a time reference that includes, but is not limited to, a signal from a GPS source or a signal from a network time reference source. The time reference may communicate time information to another device via free space (for example via radio waves), over an electrical conduit, over an optical conduit, or over some combination thereof between two network nodes that have one or more links. An example of a signal from a network time reference source is a timing signal from an IEEE1588 enabled network node.

While embodiments of the invention are generally directed to time synchronization, it may also be possible to use aspects of the invention to monitor frequency syntonization between an external reference source and a local oscillator. Frequency syntonization can be monitored by utilizing the rate of growth of the time error from the TIEC to determine if frequency error between the reference clock and local oscillator clock is within specification.

In some embodiments of the invention, a time interval error check (TIEC) capability is included in a URM for testing the OCXO mathematical models during training of the models. In some embodiments of the invention the OCXO models are recursive least squares fit (RLSF) models. As some known metrics such as, for example recursion algorithm residual error, may not be adequate for unambiguously determining convergence of the OCXO models, in some embodiments, the TIEC enables a determination of the degree to which the OCXO models converge.

During the training period, when the external reference source is available, the TIEC enables accuracy of OCXO model coefficients to be determined with respect to prediction of historical locked state correction signal data. Integration of the difference between historical control loop correction signal data and a correction signal predicted by at least one OCXO model represents a timing error that would result if the at least one OCXO model were used to predict the historical correction signal data. In this manner the TIEC can determine the timing error that would result from use of the OCXO model coefficients in a holdover event and the duration over which the timing error occurs.

In some implementations, during the training period several oscillator models are trained. After an initial training period the accuracy of the models are checked in accordance with the TIE check described in detail below. The TIE check may be updated at regular intervals following the initial training period. If a holdover event occurs TIE check metrics are used to identify the most accurate model. The initial training period and update interval are implementation specific parameters.

The TIE check enables an operator to be presented with new data with regard to the holdover capability of the NTS module. The TIE check functionality makes it possible for the operator to determine how long each base station is capable of sustaining holdover compliance.

The TIE check further enables, in a network having multiple TIE check enabled devices, for example where the devices are base stations, an operator to obtain information pertaining to any of the devices, at any time, regarding how effective the local oscillator models for the respective devices are performing and how long the models would be effective at maintaining the system time accuracy during a holdover event. This may be advantageous for a case in which multiple devices each respectively enter a holdover state, the operator can determine which of the devices is likely to fail the system time accuracy threshold first based on information provided by the TIEC of each device. Based on this information the operator can prioritize repair operations for the various devices to ensure that a device that is likely to fail first is serviced first, and devices likely to fail at a later time can be serviced accordingly.

In some embodiments, the NTS module is determined to be holdover ready if the following criteria are met:
1. A minimum training period must be complete; and
2. The TIE check must declare that one of the local oscillator models results in an absolute time error that is less than a given value over the check time which has a minimum number of hours and a maximum number of hours.

An example of a URM 100 according to an aspect of the invention will now be described with reference to FIG. 1. In addition to the elements specifically described below in FIG.

1, the URM 100 may include additional hardware and/or software used for normal operation of the URM that is not particularly relevant to the invention, and is therefore not described in detail.

URM 100 includes an antenna 105 for receiving a GPS or GNSS timing signal. The antenna 105 is coupled to a GPS receiver 110. The GSP receiver 110 is coupled to a digital phase detector 115. The digital phase detector 115 provides an output to a control loop filter 120. The control loop filter 120 provides an output to a digital-to-analog (DAC) control selector 125. The DAC control selector 125 provides an output to a DAC 130. DAC 130 provides an output to OCXO 135. The OCXO 135 provides an output to the digital phase detector 115. When the GSP signal is available, a control loop for controlling the OCXO 135 operates in the locked state and includes the digital phase detector 115, control loop filter 120, DAC control selector 125, DAC 130 and OCXO 135.

The output of control loop filter 120, in addition to being provided to the DAC control selector 125, is also provided to multiple OCXO models 150. FIG. 1 illustrates four OCXO models, M1 152, M2 154, M3 156 and M4 158. The output of control loop filter 120 is also provided to a time interval error checker (TIEC) sampled data buffer 145. Temperature sensor 140 provides a signal to the four OCXO models 152,154,156, 158 as well as the TIEC sampled data buffer 145. The temperature sensor 140 provides current ambient temperature information that is relevant to the OCXO. Outputs of the four OCXO models 152,154,156,158 and the TIEC sampled data buffer 145 are provided to a time interval error checker TIEC 160. An output of the time interval error checker (TIEC) 160 is provided to a database 165 that maintains converged model parameters output from one or more of the OCXO models 152,154,156,158, as passed to the database 165 from the TIEC 160. The database 165 provides a signal to the DAC control selector.

When operating in the locked state, the OCXO models 150 can be trained to generate a correction signal that can be used to discipline the OCXO when the external reference signal is unavailable.

During training in the locked state, the correction signal output by the control loop filter 120 and an ambient temperature value from the temperature sensor 140, respectively, are fed to the OCXO models 150 and the TIEC sampled data buffer 145. It is important to note that the data stored in the TIEC sample data buffer 145 is not used in training of the models, which is to ensure that the TIE check is conducted with "new" data that the oscillator models has not processed. The four OCXO models 152,154,156,158 determine parameters for their respective models.

The frequency stability of the OCXO may be a function of ageing as well as temperature of the oscillator. In some embodiments, the models are based on a recursive least squares fit model that represent an optimal solution to the problem of extracting temperature and time dependent frequency variation of the OCXO. In some implementations, the fit of a multidimensional polynomial provides a compact and robust solution. In some embodiments, the OCXO models modify the coefficients associated with each respective two dimensional fitting polynomial to minimize the square of the error between a model correction signal and a locked state control loop correction signal. In some embodiments, the dimensions used in the model are those of temperature and time.

During the training period, a check of the time interval error (TIE) for the models, which is a determination of the error that would result from use of each model over a specific duration of use is performed. The TIE can be determined after a particular duration and then on a periodic ongoing basis to ensure than the models are operating in a manner than they will meet the allowable time error over the given duration, or an acceptable time error over an acceptable portion of that duration. Based on input from the TIEC sampled data buffer 145, TIEC 160 evaluates the outputs from the OCXO models 150 by evaluating the TIE and selects a model having a most accurate time error. Once a most accurate model is selected, the parameters for that model are stored in database 165. In some embodiments, the most accurate time error is determined to have the smallest TIE.

During the holdover state, the TIEC 160 selects a model having the least amount of cumulative time error for an acceptable duration to generate the correction signal to discipline the OCXO. The database 165 provides model parameters from the selected model to the DAC control selector 125, which provides the parameters to the DAC 130. The DAC 130 then provides a signal to the OCXO 135.

The holdover control loop includes the OCXO models 150, the TIEC 160, the database for converged model parameters 165, DAC control selector 125, DAC 130 and OCXO 135.

In some embodiments the OCXO models 150 and the TIEC 160 in FIG. 1 may be implemented in software, hardware, or some combination thereof. For example, in a software implementation, processes used to realize the OCXO models 150 and the TIEC 160 are implemented as one or more software modules. In a hardware implementation, processes used to realize the OCXO models 150 and the TIEC 160 are implemented by, for example, but not limited to, ASIC or FPGA.

While FIG. 1 illustrates a GPS receiver 110, it should be understood that the URM 100 may include an alternative form of receiver configured to receive an alternative type of external reference signal. Furthermore, while an antenna is illustrated in FIG. 1 for receiving over-the-air communication between the URM 100 and the source of the external reference signal, it is to be understood that in addition to the antenna and receiver, or as an alternative to the antenna and receiver, there may be a wired port connection and receiver for receiving an external reference signal over a wired connection.

In a particular implementation in which the external reference signal is a GPS signal, under locked state operation the control loop is locked to a 1 pps GPS timing signal. In some embodiments, rising edges of consecutive pulses are nominally 1 second apart. Noise present in the receiver results in time jitter on the 1 pps signal edges of the order +/−25 ns rms. Processing in the control loop removes the jitter introduced by the GPS receiver 110 to enable a stable timing reference for the phase lock of the OCXO.

In some embodiments, the digital phase detector 115 uses a counter that is a function of the OCXO frequency. The counter is started by the rising edges of the GPS 1 pps signal and stopped by the rising edge of the GPS 1 pps signal. If the GPS receiver exhibits no jitter and there is no frequency drift present on the OCXO 135, then an output of the phase detector 115 is equal to a value of the counter.

In some embodiments of the invention a frequency multiplier and frequency divider are used in conjunction with the OXCO 135. For example, the frequency divider and the frequency multiplier may be located between the OCXO and the digital phase detector. Using the frequency divider and the frequency multiplier may allow a lower frequency OCXO to be used, which may reduce the financial cost of implementing the URM. However, more generally, the oscillator frequency and the manner of operation of the oscillator are implementation specific.

An important architectural aspect of the OCXO models is that they operate in parallel to the control loop. As such, the model coefficients can be viewed during the training process to determine the status and effectiveness of the training. In the event that the external reference signal becomes unavailable and the OCXO models are fully trained, the system uses at least one of the correction signals from one of the OCXO models to correct the oscillator frequency drift. In some embodiments, in the event that the OCXO models are not fully trained then the DAC value is locked to a most recent value of a multi-point moving average of the correction signal.

As discussed above in the locked state, the output of the control loop filter 120 is the correction signal that can be used in disciplining the OCXO. In some embodiments, an averaged version of the correction signal is generated from the correction signal by a correction signal moving average filter (not shown in FIG. 1). In a particular implementation, under steady state locked state conditions, the averaged correction signal is a 2000 point moving average of the correction signal. More generally, it is to be understood that the averaged correction signal is implementation specific and not limited to a 2000 point moving average. This averaged correction signal may be used by one or more of the OCXO models during the training period.

In the implementation in which the averaged correction signal is at its maximum length of 2000 points, the moving average filter buffer takes 2000 seconds, which is approximately 33 minutes, to acquire a new value of the averaged correction signal. The delay associated with the moving average filter may introduce large time transients during the transition from the holdover state to a recovery state. In order to avoid such transient ringing, a correction signal moving average filter is updated only for certain conditions.

In some embodiments, in addition to protection of the correction signal moving average filter against time transients, there is also a limit placed on the sample-to-sample frequency error of +/−5 ppb for acceptable input data to the moving average filter. If the input data to the filter differs from the previous data value by +/−5 ppb then the previous data value is held. Such data screening protects the moving average filter from outliers in the correction signal and adds robustness against an invalid external reference signal, for example in the case of a GPS signal, an invalid GPS signal due to GPS jamming or spoofing.

A more detailed example of a method of operation of performing a TIE check will now be described. The control loop is allowed to stabilize for one hour following power up of the device that includes a NTS module. During the stabilization period, transients in the moving average filter are extinguished, as the time constant of the filter is set to a time that is long enough to allow transients to substantially dissipate. Following stabilization of the control loop, and provided that the NTS module is locked to the external reference timing signal, training of the at least one OCXO model with respect to the control loop correction signal is initiated. During training of the model the correction signal, the averaged correction signal, a timing signal from the external reference timing signal and temperature information are stored at a predetermined sampling rate in the TIEC sampled data buffer. In a particular implementation, the parameters are stored in the TIEC sampled data buffer every 15 seconds. However, it is to be understood that the sampling rate is implementation specific and not limited to the example of 15 seconds.

After a given training duration each model is checked with respect to its accuracy in predicting control loop correction states. The check is conducted following the given training duration because this time frame represents the memory of the RLSF based on a forgetting factor.

The RLSF model uses an exponential forgetting factor to weight the significance of historical data with respect to how that data is used in determining the values of the model coefficients. In the RLSF, the forgetting factor is set such that the given training duration of data is significant.

Decreasing the forgetting factor value increases the tracking bandwidth. In some embodiments, RLSF models show that a tracking bandwidth equivalent to 5 hours of significant data results in the thermal hysteresis of the OCXO causing the model coefficient values to vary depending on whether the temperature is increasing or decreasing. By increasing the forgetting factor time to, for example 12 hours, thermal hysteresis is averaged out as model coefficient values from a positive temperature ramp are averaged with those of a negative ramp. The forgetting factor is not intended to be limited to 12 hours, but is an implementation specific variable.

In some implementations, such as when there is minimal temperature variation, the RLSF model remains valid for that temperature range during a holdover event. In other words, there is no minimum temperature range requirement for convergence of the algorithm. The temperature range exercised during training, however, does determine the temperature range for which the trained model is accurate during holdover.

The difference between the historical values of the loop correction signal stored in the TIEC sample data buffer and that which is calculated from the OCXO model based on the coefficients extracted from the training process represent a frequency error present in the OCXO model. It is important to note that the data stored in the TIEC sample data buffer is not used in training of the TIEC, this is to ensure that the TIEC is conducted with "new" data that the TIEC has not processed.

Integration of the frequency error between the predicted correction and the TIEC buffer correction yields the cumulative time error over the holdover check time. Since the TIEC sampled data buffer is populated with signal values collected at a given sampling rate, the time error is equal to the integral of the frequency error multiplied by the reciprocal of the sampling rate. Since the integral contains a variable for the sample time the time error may be calculated for arbitrary sample times. Longer sample times may reduce the accuracy of the time error calculation.

In a particular implementation, four OCXO models are checked to determine their relative accuracy and thus enable selection of the most accurate of the four models. A first model contains both ageing and temperature dependent coefficients of frequency stability. A second model contains just temperature dependent coefficients. A third model contains a constant value that would be applied at the time of holdover in the case that the DAC is held constant. A fourth model contains the previously converged model parameters that were considered optimal based on a last holdover check conducted. These four models may correspond to M1 to M4 illustrated in FIG. 1. As discussed above, the number of models is implementation specific and is not intended to be limited to the example of only four.

Figure 2:
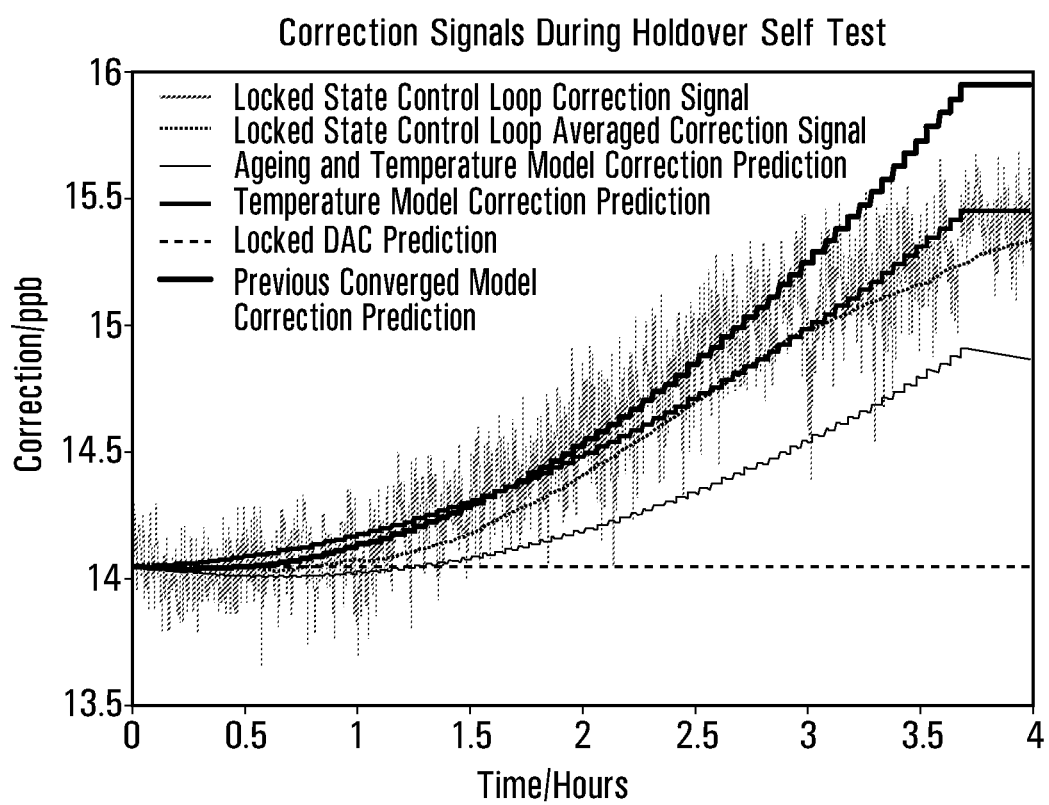
FIG. 2 is a graphical plot of an example of correction signals generated as a function of an external reference signal and predicted correction signals for oscillator models trained when the external reference signal is available.

FIG. 2 is an example plot of multiple correction signals over a four hour duration of time. The horizontal axis represents time and the vertical axis represents an amount of correction in parts per billion (ppb). The signals in the graph include the locked stated control loop correction signal that is a function of the external reference signal, the averaged correction signal, and predicted correction signals for each of four models: ageing and temperature model; temperature model, constant (locked) DAC model; and previous converged parameter model.

Figure 3:
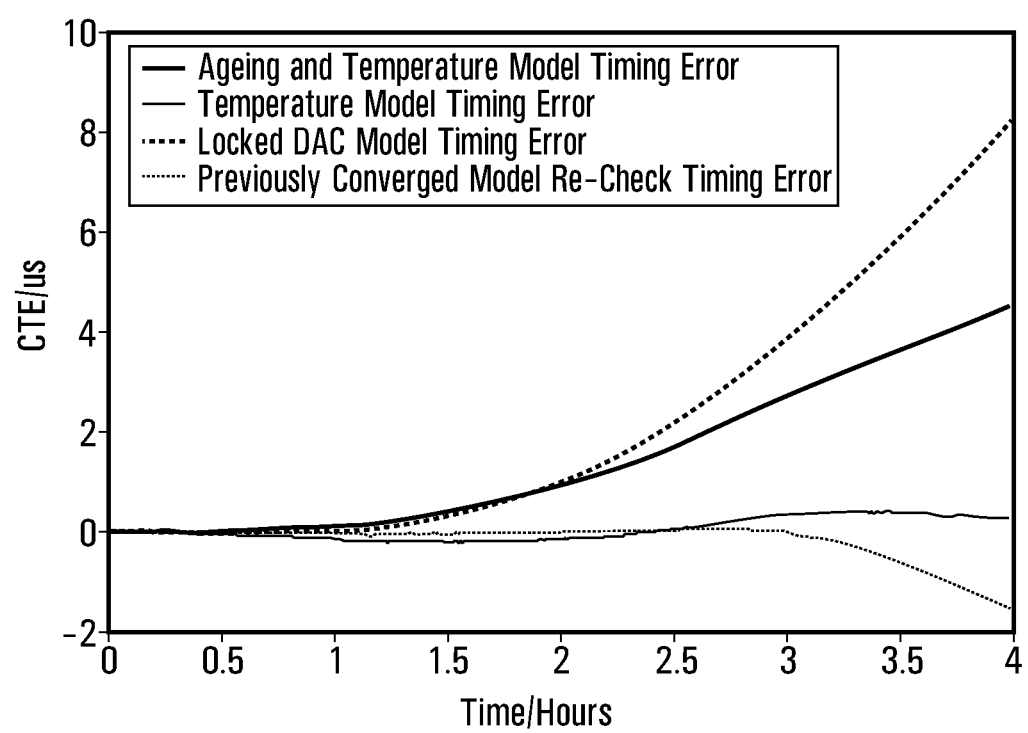
FIG. 3 is a graphical plot of an example of cumulative time error signals generated from predicted correction signals for oscillator models trained when the external reference signal is available.

FIG. 3 is an example plot of multiple timing error signals over the same four hour duration of time as FIG. 2. The horizontal axis represents time and the vertical axis represents an amount of cumulative time error (CTE) in microseconds (µs). The signals in the graph include the cumulative time error for each of the four models: ageing and temperature model; temperature model, constant (locked) DAC model; and previous converged parameter model.

In a first phase of model selection, a model accumulates a time error that is less than the system holdover specification. In some embodiments, the timing error should be a value less than the time error for the TIE check. A maximum time error specification may be used in this preliminary gate to ensure that any holdover check that meets the time error specification over any duration is passed.

A second phase of the TIE check compares the relative magnitudes of the maximum timing error resulting from each model. The coefficients of the model that exhibits the lowest maximum cumulative timing error are stored for use as the converged coefficients. The TIE check is repeated at regular intervals during cumulative locked state operation. In some embodiments, up to 24 hours of data is stored in the TIE sample data buffers. Consequently, when fully populated, the check buffers can be used to conduct a holdover test over the full duration specified for the device. It should also be noted that the converged model may be continuously checked by the TIEC at regular intervals such that the model coefficients never become out of date. In some embodiments, continuously updating previously converged model coefficients at regular intervals is important to confirm their effectiveness with respect to meeting the holdover time error specification.

In some embodiments, if there is minimal temperature variation during the training period the best temperature based model will be selected over a static DAC model provided that a TIEC time error threshold is not exceeded. A reason for this selection is that the static DAC model has no provision for compensating for a temperature variation during holdover. Thus, even if the temperature model is not the best with respect to the TIE check it will be selected.

Figure 4:
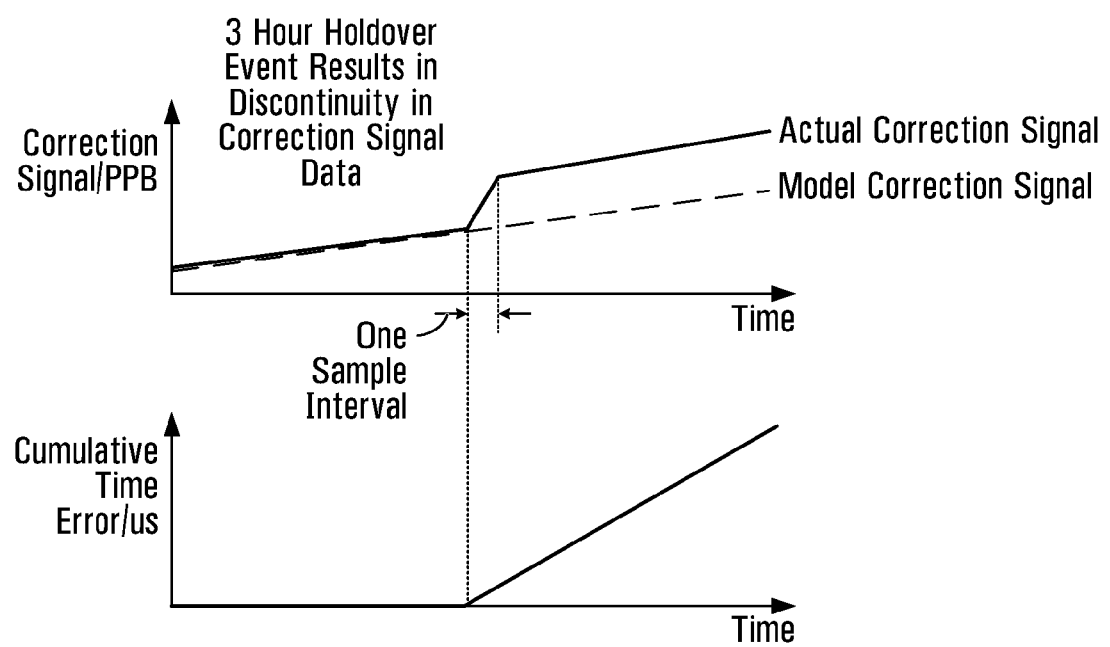
FIG. 4 is a graphical plot of data stored during the training process illustrating a discontinuity that occurs during a holdover event according to an embodiment of the invention.

In some embodiments, when a holdover event occurs, the data flow to the TIEC sampled data buffers is stopped. When the holdover event is over then data flow to the TIEC sampled data buffers is resumed. A holdover event of several hours will introduce a discontinuity in the TIEC sampled data buffers data which may result in an incorrect TIEC calculation, as illustrated in FIG. 4. To correctly check the holdover models a constant offset may be re-calculated for each model at the first point following detection of a holdover discontinuity. The holdover discontinuity is detected by monitoring the interval between the sample times for the collected holdover check data. If the sample time exceeds that specified in the system then a holdover discontinuity is present.

In a case of a RLSF model, there are quadratic parameters, linear parameters, and constant parameters that define the model. In some embodiments, in the event of a holdover discontinuity a constant parameter of each model may be re-calculated based on the averaged correction signal. Re-calculation of the constant term maintains the validity of the RLSF model in the case of such discontinuous data sets.

In some embodiments, the ageing and temperature based model will fail cumulative time error (CTE) specification for the system as a result of incorrect extraction of the ageing rate of the crystal oscillator. In such cases the temperature model can often still prove sufficiently accurate to meet the holdover specification and consequently may be selected by a TIEC model selector. In the event that the temperature model also fails the CTE specification, then the RLSF model is reset. Such an event may occur for example when there is significant frequency recovery during initial frequency stabilization of the OCXO. In the event that the RLSF model is reset, the TIEC sampled data buffer is also reset. Following a reset of the RLSF model the system requires a particular training duration of cumulative locked state training before a TIE check is performed.

In some embodiments of the invention, a TIEC metric enables an estimate of the holdover capability of the NTS module. In some embodiments, the accuracy of TIEC with respect to actual holdover performance of the NTS module is a function of the degree of correlation between temperature and a correction signal generated by the control loop. In some embodiments, it may be advantageous if the temperature and correction signal is correlated to a specified level to determine the confidence in the prediction capability of the model. In some implementations, a Pearson product-moment correlation coefficient may be used as an additional metric for use in conjunction with TIEC for increasing a level of confidence in the holdover readiness state.

In some embodiments of the invention, a task of the NTS module is to meet the time and frequency synchronization requirement of an LTE radio. In some embodiments, the LTE radio is designed to inter-operate with CDMA radio systems.

Figure 5:
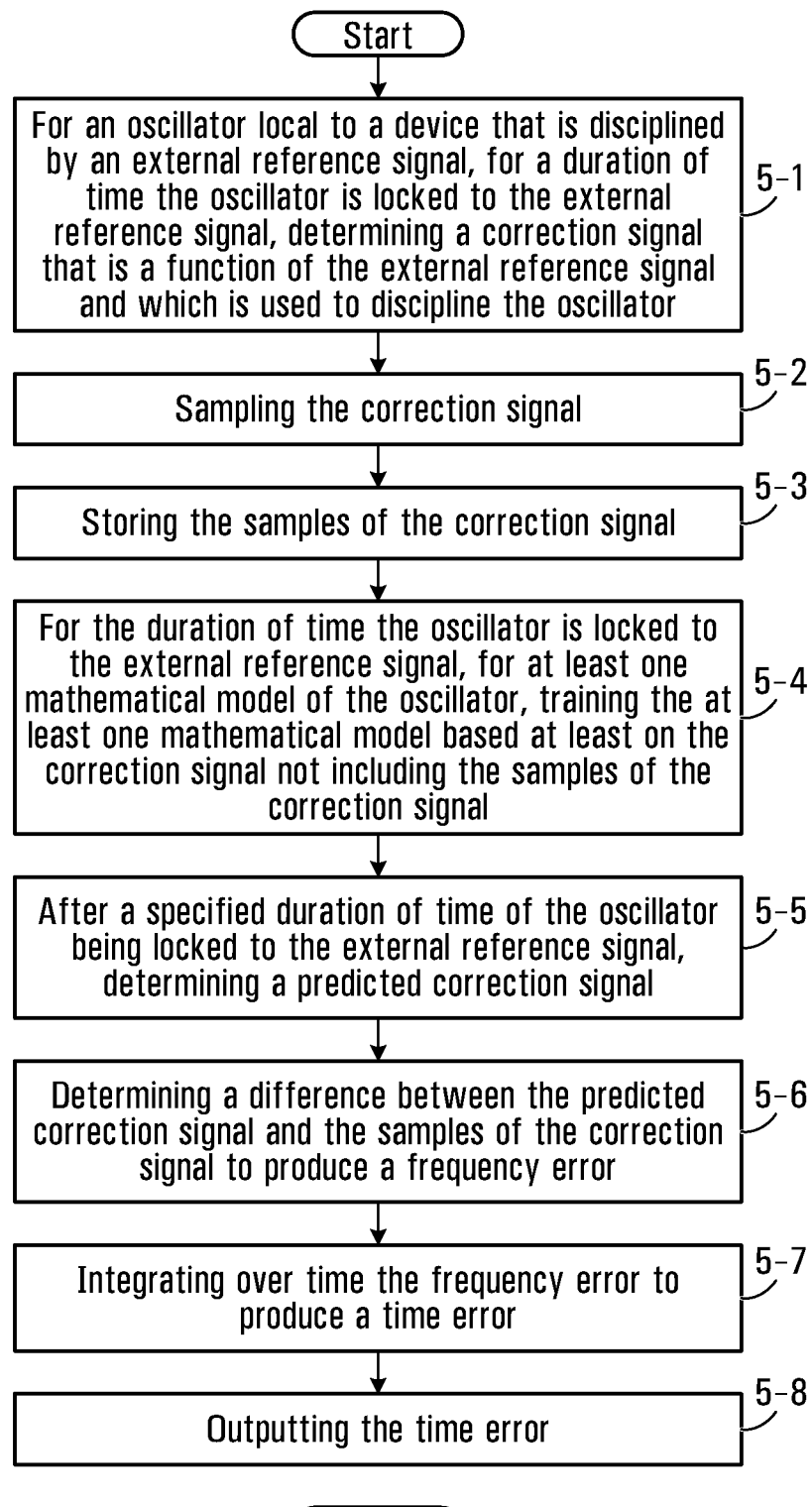
FIG. 5 is a flow chart illustrating an example of a method according to an aspect of the invention.

A generalized method for implementing the TIE check will now be described with reference to FIG. 5.

A first step 5-1 of the method involves, for an oscillator local to a device that is disciplined by an external reference signal, for a duration of time the oscillator is locked to the external reference signal, determining a correction signal that is a function of the external reference signal and which is used to discipline the oscillator.

A second step 5-2 of the method involves, for the duration of time the oscillator is locked to the external reference signal, sampling the correction signal.

A third step 5-3 of the method involves, for the duration of time the oscillator is locked to the external reference signal, storing the sampled correction signal.

A fourth step 5-4 of the method involves, for the duration of time the oscillator is locked to the external reference signal, for at least one mathematical model of the oscillator, training the at least one mathematical model based at least on the correction signal not including the samples of the correction signal;

A fifth step 5-5 of the method involves, after a specified duration of time of the oscillator being locked to the external reference signal, determining a predicted correction signal.

A sixth step 5-6 of the method involves, for the duration of time the oscillator is locked to the external reference signal, determining a difference between the predicted correction signal and the samples of the correction signal to produce a frequency error that represents an error that would occur if the predicted correction signal was used to discipline drift in the oscillator.

A seventh step 5-7 of the method involves, for the duration of time the oscillator is locked to the external reference signal, integrating over time the frequency error to produce a time error that represents an error that would occur if the predicted correction signal was used to discipline drift in the oscillator.

An eighth step 5-8 of the method involves, outputting the time error.

A further method for implementing the TIE check will now be described with reference to FIG. 6.

A first step 6-1 of the method involves, for an oscillator local to a device that is disciplined by an external reference signal, while locked to the external reference signal, training at least two mathematical models of the oscillator to determine a predicted correction signal for each mathematical model based at least in part on a correction signal that is a function of the external reference signal and which is used to discipline drift in the oscillator.

A second step 6-2 of the method involves, while locked to the external reference signal, selecting a mathematical model of the at least two mathematical models having a smallest time error to discipline drift in the oscillator when the external reference signal is unavailable.

A third step 6-3 of the method involves, while locked to the external reference signal, testing the selected mathematical model using a sampled version of the correction signal such that the selected mathematical model can be used without the need for a testing duration that is in addition to a period of time used for the training.

Figure 6:
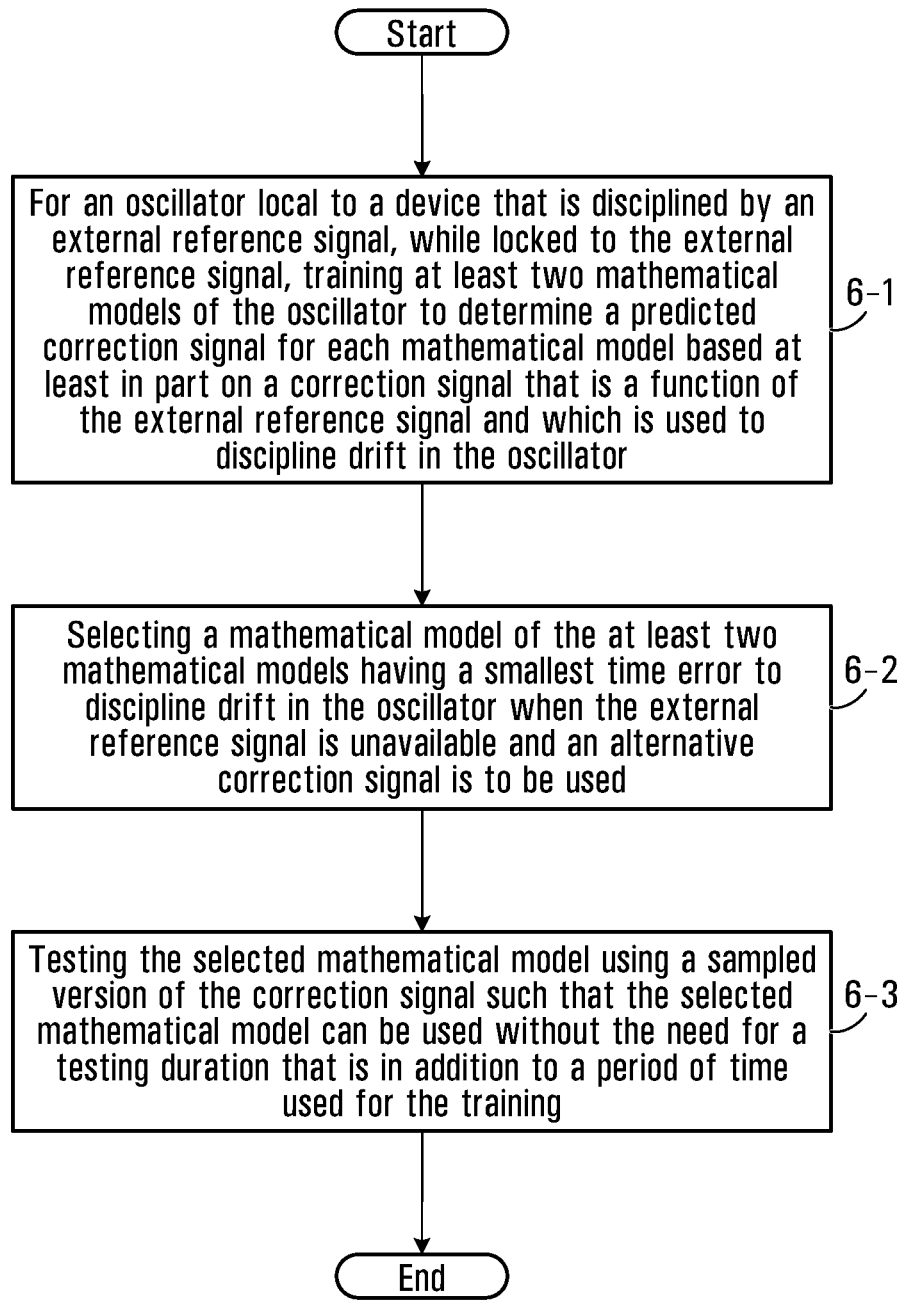
FIG. 6 is a flow chart illustrating another example of a method according to an aspect of the invention.

While FIG. 6 describes that selection of a mathematical model occurs prior to the testing of the selected model, this is not intended to limit the scope of the invention. In some embodiments, the testing of the models is done for all models and a model is selected based on a result of the tests.

Figure 7:
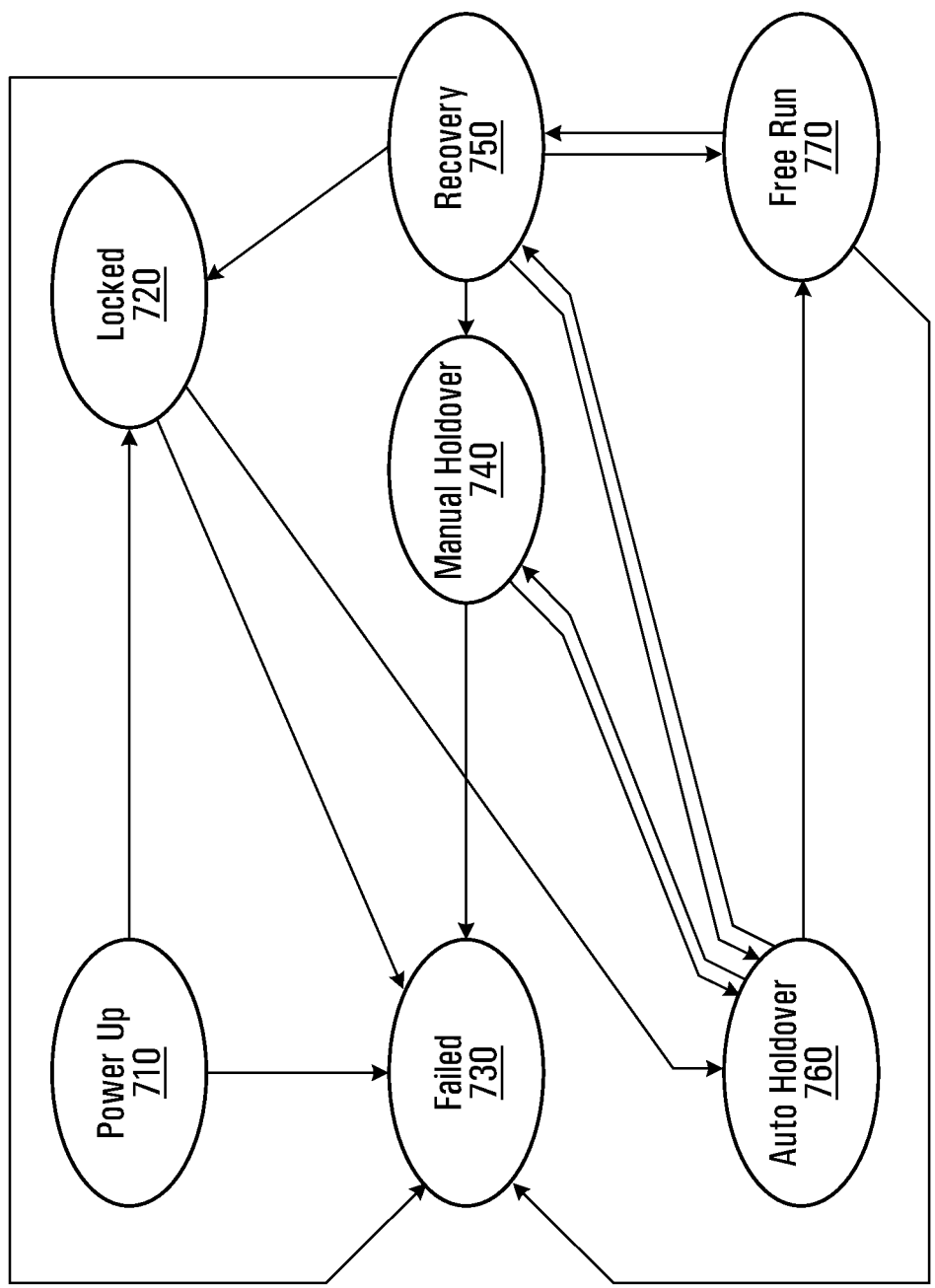
FIG. 7 is a finite state diagram according to an embodiment of the invention.

An example of operating states of the NTS module will now be described with reference to FIG. 7.

A first state is a power up state 710 in which the universal radio module is powered up. From the power up state 710, the NTS module either enters a locked state 720 or a failed state 730.

The failed state 730 is entered if a hardware failure is detected.

In the locked state 720, the oscillator is phase locked to the external reference signal and as such the timing error relative to system time, a stratum 1 traceable reference source, is less than a specified value. The oscillator models can be trained and the TIE check performed during this state. From the locked state 720, the NTS module may enter the failed state 730 or an auto holdover state 760.

The auto holdover state 760 is entered when there is a loss of the external reference signal. In a holdover state if the oscillator model has been declared as trained then it will be used as a state predictor to provide the correction signal to the oscillator.

Conditional holdover is a subset of the auto holdover state 760. In the case that holdover is entered and the oscillator model training is incomplete then the DAC used to discipline the oscillator frequency is held at the correction signal value determined from the moving average filter present in the control loop. The oscillator model can be considered accurate and valid for a time determined from the CTE that would result from the frequency error resulting from the worst case ageing rate and temperature sensitivity. As such the conditional holdover may be significantly shorter than the specified 24 hour holdover.

In an alternative conditional holdover scenario, the oscillator model has been trained over a specified temperature range and that temperature range is exceeded during the holdover event. If the holdover temperature range exceeds the training mode temperature range the oscillator model continues to be used but is no longer as accurate with respect to the temperature variation. The inaccuracy in the prediction of the oscillator model outside the training temperature range is a result of the nonlinear form of the model, which in the present implementation has a quadratic dependence on temperature. In such a scenario the existing CTE will be unknown as there is no reference signal during holdover, consequently it is not possible in this scenario to make any estimate as to the continued duration of a valid holdover. During training, a quadratic model is adapted to fit the correction signal variation as a function of temperature. If during training the temperature variation is less than the temperature variation during a holdover event then the model may be inaccurate when used to extrapolate solutions outside the training temperature range.

It should be noted that such a limitation is reasonable in that in the case of a non-linear model accurate characterization will require full temperature variation experienced during a holdover event to be a subset of that experienced during the training period. A difference of 0.1 ppb between the OCXO model and the real OCXO stability when integrated over a 24 hour holdover event can result in a time error of 8.64 µs. Error introduced during a holdover event that exceeds the model training range will be described with reference to FIG. 9.

Figure 9:
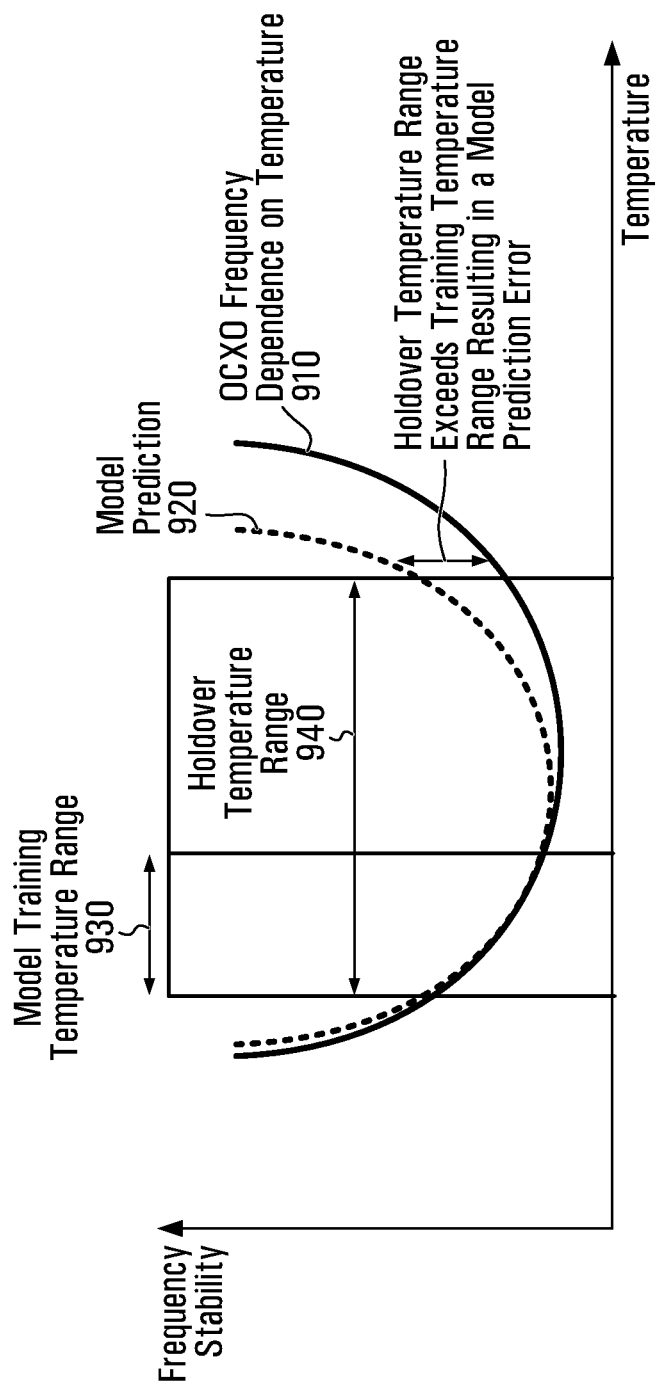
FIG. 9 is a graphical plot of operation of an oscillator and a model of an oscillator over different temperature ranges.

FIG. 9 is a graphical plot of illustrating oscillator frequency dependence on temperature and how model prediction may result in an error if the holdover event temperature range is larger than the model training temperature range. The vertical axis of the plot pertains to frequency stability and the horizontal axis pertains to temperature. The oscillator frequency dependence over temperature curve is indicated at 910 and the model prediction frequency dependence over temperature curve is indicated at 920. The model training temperature range is indicated at 930 and the holdover temperature range is indicated at 940. It can be seen that the model is representative of the oscillator itself in the training range, but at the edge of the holdover temperature range farthest away from the model training temperature range, indicated at 950, a large model prediction error occurs.

Consequently, if such a conditional holdover is entered a flag may be set to indicate that the timing error specification of holdover may be violated at any time.

When in the auto holdover state 760 the NTS module can enter any one of a manual holdover state 740, a recovery state 750 or a free run state 770.

The manual holdover state 740 is a state that enables the holdover performance to be tested through generation of an artificial holdover event. When in the manual holdover state 740 the NTS module can enter either one of the failed state 730 or the auto holdover state 760.

If the holdover event extends beyond a specified system holdover time (for example 24 hours) then at the point the holdover exceeds the specified holdover time the NTS module enters the free run state 770. The free run state 770 does not result in any changes to the control signal, but it translates to a relaxation in the absolute frequency accuracy specification of the NTS module from 50 ppb to 2 parts per million (ppm) and a cessation of any time error accuracy specification. In some embodiments, a flag may be set to indicate that the free run state 770 has been entered. When in the free run state 770 the NTS module can enter the recovery state 750 or the failed state 730.

The recovery state 750 is entered when a valid external reference signal becomes available. At the instance that a valid external reference is declared, phase error between the locally generated 1 pps signal and the external reference 1 pps signal is determined. During the recovery state 750 the holdover time error is applied as a time offset to the control loop. The control loop removes the time error by either increasing or decreasing the frequency of the oscillator. The end of the recovery state 750 and return to locked state 720 operation is signified when the time error relative to external reference signal has been reduced to below a specified value. The value is specific to a given implementation. At the end of the recovery state 750 the correction signal is applied to the control loop moving average filter, which up until this point in time may have been frozen at the value directly before entering holdover. When in the recovery state 750 the NTS module can enter any one of the manual holdover state 740, the auto holdover state 760, the locked state 720, the failed state 730 or the free run state 770.

A system including a device having a local oscillator configured to perform oscillator model training and TIE check during a training period when an external source is available according to the present invention will now be described with reference to FIG. 8. The system 800 includes the device 850 and multiple external reference sources, any one of which could be used to discipline the local oscillator.

An external reference source is a timing reference source. In FIG. 8, a first external reference source is network clock 810 which receives a time signal from satellite 820 and then forwards the time signal to device 850 via network node 860. A second external reference source is the satellite 820 that provide GPS timing information directly to the device 850. In some embodiments, more than one satellite may be available to provide timing signals. A third external reference source is network clock 840 that transmits a time signal to the device 850 via network nodes 842,844,846. A fourth external reference source is network clock 830 that transmits a reference signal to device 850 via base station (BTS) 835. A fifth external reference source is network clock 875 that transmits a reference signal to device 850 via BTS 880, using wireless mobile device 870 as a relay.

Of the various external reference sources from which the device may receive a time signal, some may be ultimately derived from the same source, but depending on availability at any given time, not all might be available at the same time. For instance, satellite 820 supplies time information directly to device 850 as well as via a network node that contains network clock 810. At a given time due to inclement weather in close proximity to device 850, the device 850 may not be able to receive the timing information from satellite 820. However, the ability of the node containing network clock 810 to receive information from satellite 820 is not interrupted by the inclement weather. Network clock 810 is able to receive the timing information from satellite 820 and forward the time signal to device 850.

In some embodiments, the various external reference sources may originate from unrelated i.e. unsynchronized network clocks.

Figure 8:
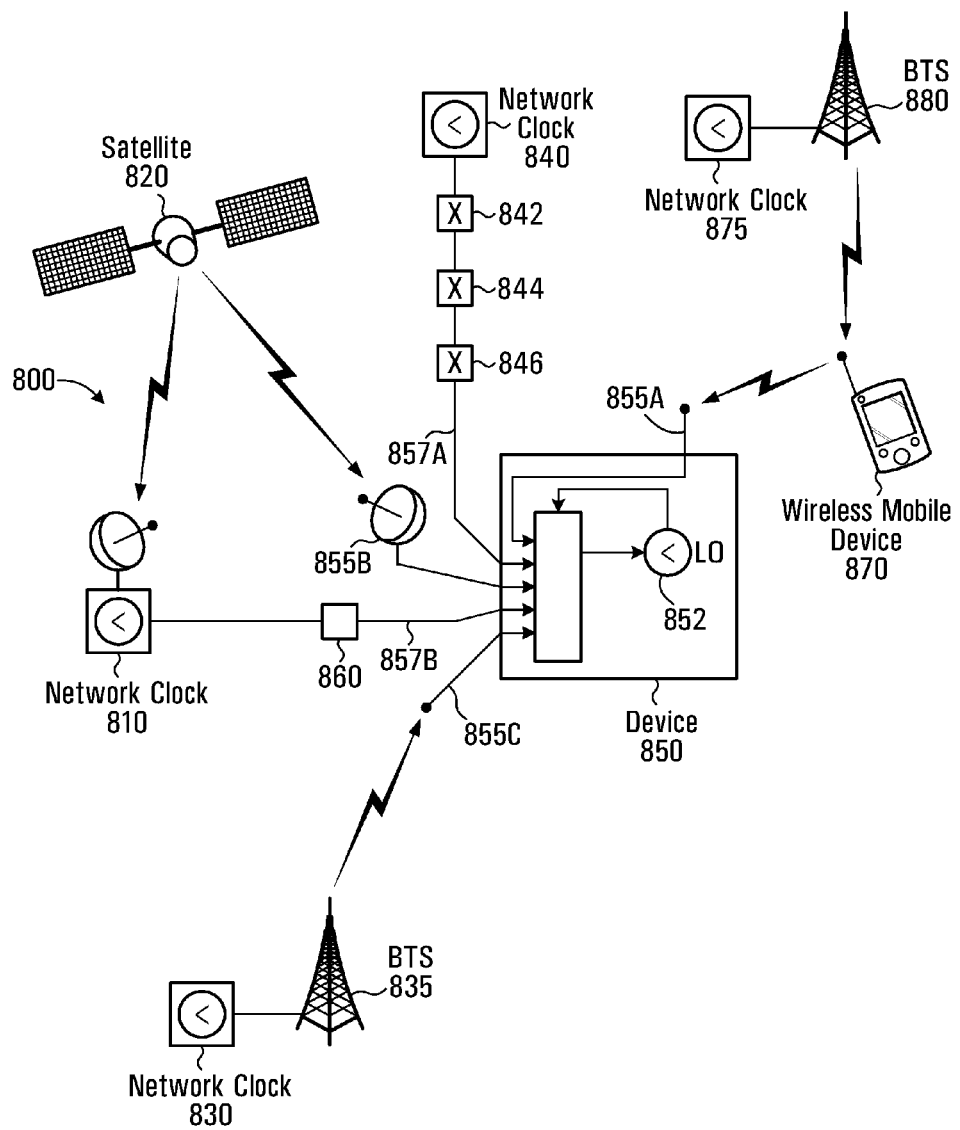
FIG. 8 is a schematic diagram of a system in which some embodiments of the present invention may be implemented.

While a wireless mobile device is shown as a relay device in FIG. 8, it is to be understood that devices other than wireless mobile devices can act as relay devices. In an alternative implementation, a relay is a simplified BTS designed to transfer wireless signals in regions where there are inadequate BTS, such as in rural areas or where there are urban canyons which can cause severe fading problems. For example, a first device having a first LO may receive time information to discipline the first LO from a second device having a second LO, in which the second LO is being disciplined by an external reference source.

The device 850 of FIG. 8 has three antennas 855A,855B, 855C to receive wireless signals from one or more of the external reference sources. Antennas 855A and 855C receive wireless signals from wireless mobile device 870 and BTS 835, respectively, and antenna 855B receives wireless signals from satellite 820. The number of antennas that a device includes is implementation specific. An antenna may be used to receive signals from more than one external reference source.

In some embodiments, the device 850 is connected to one or more of the external reference sources via a wired network connection. The device 850 of FIG. 8 is connected to network clock 840 via network nodes 842,844,846 by a wired connection. The last link between network node 846 and slave device 850 is indicated by wired link 857A. The device 850 of FIG. 8 is also connected to network clock 510 via network nodes 860 by a wired connection. The last link between network node 860 and device 850 is indicated by wired link 857B. The number of wired connections to network clocks is implementation specific. Furthermore, the number of hops between a network clock and the device via network nodes is implementation specific.

In some embodiments the connection between the network clock and the device could be some combination of wired and wireless links.

FIG. 8 illustrates only a single device 850 in the system 800, but it is to be understood that a network may have more than one device of the type described herein. Factors that may affect the number of devices in a network include, but are not limited to, the size of the network, the geographical terrain the network covers and the power requirements of the device and/or external reference sources.

Types of external reference sources are not intended to be limited to only those described with reference to FIG. 8. The external reference sources illustrated in FIG. 8 are merely used as exemplary types of external reference sources. Other types of external reference sources that provide time signals to the device include external reference sources that may perform network distribution of: atomic clock signals using rubidium or cesium standards; Long Range Aid to Navigation (LORAN) timing signals; and synchronization signals present in television broadcast signals.

FIG. 8 is illustrative of different types of external reference sources and difference types of connections between the references sources and the slave device. Implementations of embodiments of the invention are implementation specific and may include types of reference sources and connections described specifically in FIG. 8 or other types of reference sources and connections described herein.

In some embodiments, the external reference source can transmit a time signal to the device in a physical layer, for example a layer 1 implementation. In some embodiments, the physical layer implementation is performed in accordance with the Synchronous Ethernet (SyncE) standard.

In some embodiments, the external reference source can transmit a time signal to the device in a software layer, for example, a layer 2 implementation.

In some embodiments, the device may be a part of a BTS in a wireless communication network. In some embodiments, the device may be part of a network node, such as a relay in wireless communication network. In some embodiments, the device may be part of an enterprise network. In some embodiments, the device may be a wireless terminal in the wireless communication network, for example, but not limited to, a cell phone or wirelessly enabled computer or Personal data Assistant (PDA). Generally speaking, the device may be part of, or located in closed proximity to, any type of network element in a network in which the network element can utilize a localized timing source such as a LO. In some embodiments, the use of an LO, which can be disciplined in the manner described herein may enable the use of a less expensive type of LO in the network element, which correspondingly reduces the financial cost of the network element.

Multiple external reference sources are illustrated as being received by the device 850 in FIG. 8. Examples of how a secondary external reference source signal may be selected if a primary most accurate external reference source signal is temporarily unavailable are described in co-pending U.S.

patent application Ser. No. 12/487,933, which is incorporated herein by reference in its entirety.

In some embodiments, the device may be configured to receive only a single time reference of any of the external reference sources described above.

Numerous modifications and variations of the present invention are possible in light of the above teachings. It is therefore to be understood that within the scope of the appended claims, the invention may be practiced otherwise than as specifically described herein.

The invention claimed is:

1. A method for controlling an oscillator, comprising:
receiving a reference signal during a training period;
determining, based on the reference signal, a correction signal suitable for controlling operation of the oscillator by correcting oscillator frequency drift;
sampling the correction signal for the training period;
storing the correction signal samples;
training a mathematical model of the oscillator based on the correction signal not including the correction signal samples; and
testing the trained mathematical model of the oscillator against the correction signal samples to assess suitability of the trained mathematical model for generating a correction signal for controlling operation of the oscillator when the reference signal is not available.

2. The method as defined in claim 1, comprising:
training at least two mathematical models based on the correction signal;
testing the at least two trained mathematical models against the correction signal samples; and
responsive to the testing, selecting one of the at least two trained mathematical models for generating a correction signal for controlling operation of the oscillator when the reference signal is not available.

3. The method as defined in claim 2, comprising:
training the at least two mathematical models based on the correction signal;
testing the at least two trained mathematical models against the correction signal samples by:
using each trained mathematical model to generate a respective modelled correction signal;
determining a difference between each modelled correction signal and the correction signal determined based on the reference signal to determine a respective error signal for each trained mathematical model; and
integrating each error signal over time to derive respective error parameter; and
selecting, based on the respective error parameters, one of the at least two trained mathematical models for generating a correction signal for controlling operation of the oscillator when the reference signal is not available.

4. The method as defined in claim 1, wherein testing the mathematical comprises:
using the trained mathematical model to generate a modelled correction signal;
determining a difference between the modelled correction signal and the correction signal determined based on the reference signal to determine an error signal and
integrating the error signal over time to derive an error parameter.

5. A system for controlling an oscillator, comprising:
a receiver operable to receive a reference signal during a training period;
a correction signal generator operable to determine, based on the reference signal, a correction signal suitable for controlling operation of the oscillator by correcting oscillator frequency drift;
a sampler operable to sample the correction signal;
memory to store the correction signal samples;
a training element operable to train a mathematical model of the oscillator based on the correction signal not including the correction signal samples; and
a comparator operable to test the trained mathematical model of the oscillator against the correction signal samples to assess suitability of the trained mathematical model for generating a correction signal for controlling operation of the oscillator when the reference signal is not available.

6. The system as defined in claim 5, comprising:
at least two training elements, each training element operable to train a respective mathematical model based on the correction signal;
wherein the comparator is operable to test the at least two trained mathematical models against the correction signal samples; and
the system further comprises a selector operable responsive to the testing to select one of the at least two trained mathematical models for generating a correction signal for controlling operation of the oscillator when the reference signal is not available.

7. The system as defined in claim 6, wherein:
the at least two training elements are operable to train the at least two mathematical models based on the correction signal;
the comparator is operable to test the at least two trained mathematical models against the correction signal samples by determining a difference between a respective modelled correction signal generated by each mathematical model and the correction signal determined based on the reference signal to determine a respective error signal for each trained mathematical model; and
the system further comprises:
an integrator operable to integrate each error signal over time to derive respective error parameter; and
a selector operable to select, based on the respective error parameters, one of the at least two trained mathematical models for generating a correction signal for controlling operation of the oscillator when the reference signal is not available.

8. The system as defined in claim 5, wherein:
the trained mathematical model is operable to generate a modelled correction signal;
the comparator is operable to determine a difference between the modelled correction signal and the correction signal determined based on the reference signal to determine an error signal; and
the system further comprises an integrator operable to integrate the error signal over time to derive an error parameter.

* * * * *

UNITED STATES PATENT AND TRADEMARK OFFICE
CERTIFICATE OF CORRECTION

PATENT NO. : 8,884,706 B2  Page 1 of 1
APPLICATION NO. : 13/072285
DATED : November 11, 2014
INVENTOR(S) : Charles W. T. Nicholls and Philippe Wu It is certified that error appears in the above-identified patent and that said Letters Patent is hereby corrected as shown below:

In the Claims

Column 17, Line 59, in Claim 4, delete "signal and" and insert -- signal; and --, therefor.

Signed and Sealed this
Fourteenth Day of April, 2015

Michelle K. Lee
*Director of the United States Patent and Trademark Office*